(12) United States Patent
Lin et al.

(10) Patent No.: US 9,111,770 B2
(45) Date of Patent: Aug. 18, 2015

(54) POWER SEMICONDUCTOR DEVICE AND FABRICATION METHOD THEREOF

(71) Applicant: Anpec Electronics Corporation, Hsin-Chu (TW)

(72) Inventors: Yung-Fa Lin, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/509,071

(22) Filed: Oct. 8, 2014

(65) Prior Publication Data

US 2015/0054062 A1  Feb. 26, 2015

Related U.S. Application Data

(63) Continuation of application No. 13/902,850, filed on May 26, 2013, now Pat. No. 8,963,260.

(30) Foreign Application Priority Data

Mar. 26, 2013  (TW) .............................. 102110729 A

(51) Int. Cl.
*H01L 29/06* (2006.01)
*H01L 29/78* (2006.01)
*H01L 27/088* (2006.01)
*H01L 29/40* (2006.01)
*H01L 29/49* (2006.01)

(52) U.S. Cl.
CPC .......... *H01L 29/0634* (2013.01); *H01L 27/088* (2013.01); *H01L 29/0619* (2013.01); *H01L 29/402* (2013.01); *H01L 29/4916* (2013.01); *H01L 29/78* (2013.01); *H01L 29/7811* (2013.01)

(58) Field of Classification Search
CPC . H01L 29/78; H01L 29/0634; H01L 29/0619; H01L 29/402; H01L 29/4916; H01L 29/7811; H01L 27/088
See application file for complete search history.

(56) References Cited

U.S. PATENT DOCUMENTS

| 8,680,620 B2 * | 3/2014 | Salcedo et al. | 257/355 |
| 8,963,260 B2 * | 2/2015 | Lin et al. | 257/409 |
| 2011/0115033 A1 * | 5/2011 | Tamaki et al. | 257/409 |
| 2013/0062723 A1 * | 3/2013 | Henning et al. | 257/484 |
| 2013/0277763 A1 * | 10/2013 | Ohta et al. | 257/409 |

FOREIGN PATENT DOCUMENTS

CN  102074581 A  5/2011

* cited by examiner

*Primary Examiner* — Victor A Mandala
(74) *Attorney, Agent, or Firm* — Winston Hsu; Scott Margo

(57) ABSTRACT

A power semiconductor device includes a cell region on a semiconductor substrate, at least a transistor device in the cell region, a peripheral termination region encompassing the cell region, a plurality of epitaxial islands arranged around the cell region, and a grid type epitaxial layer in the peripheral termination region. The grid type epitaxial layer separates the plurality of epitaxial islands from one another.

5 Claims, 15 Drawing Sheets

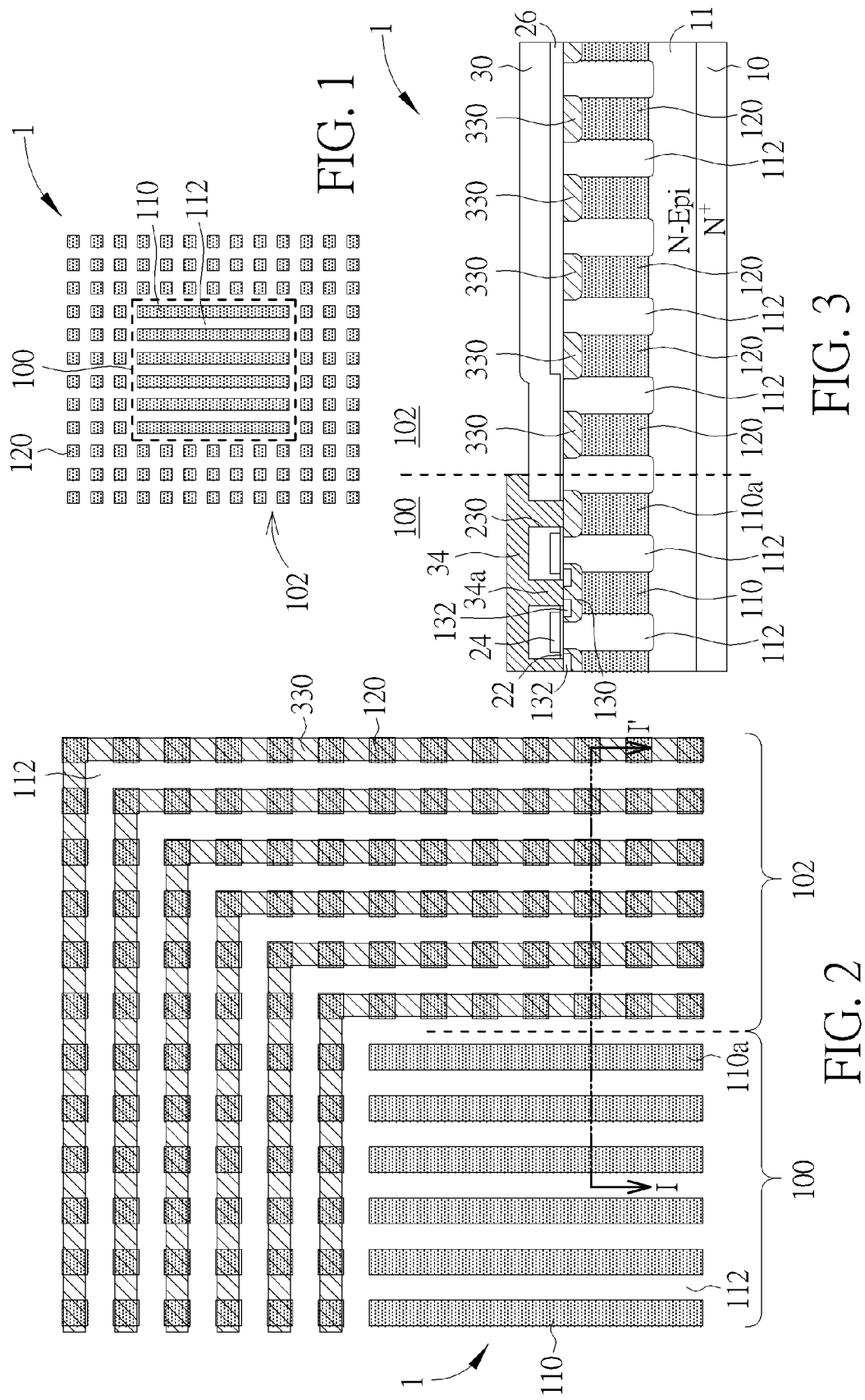

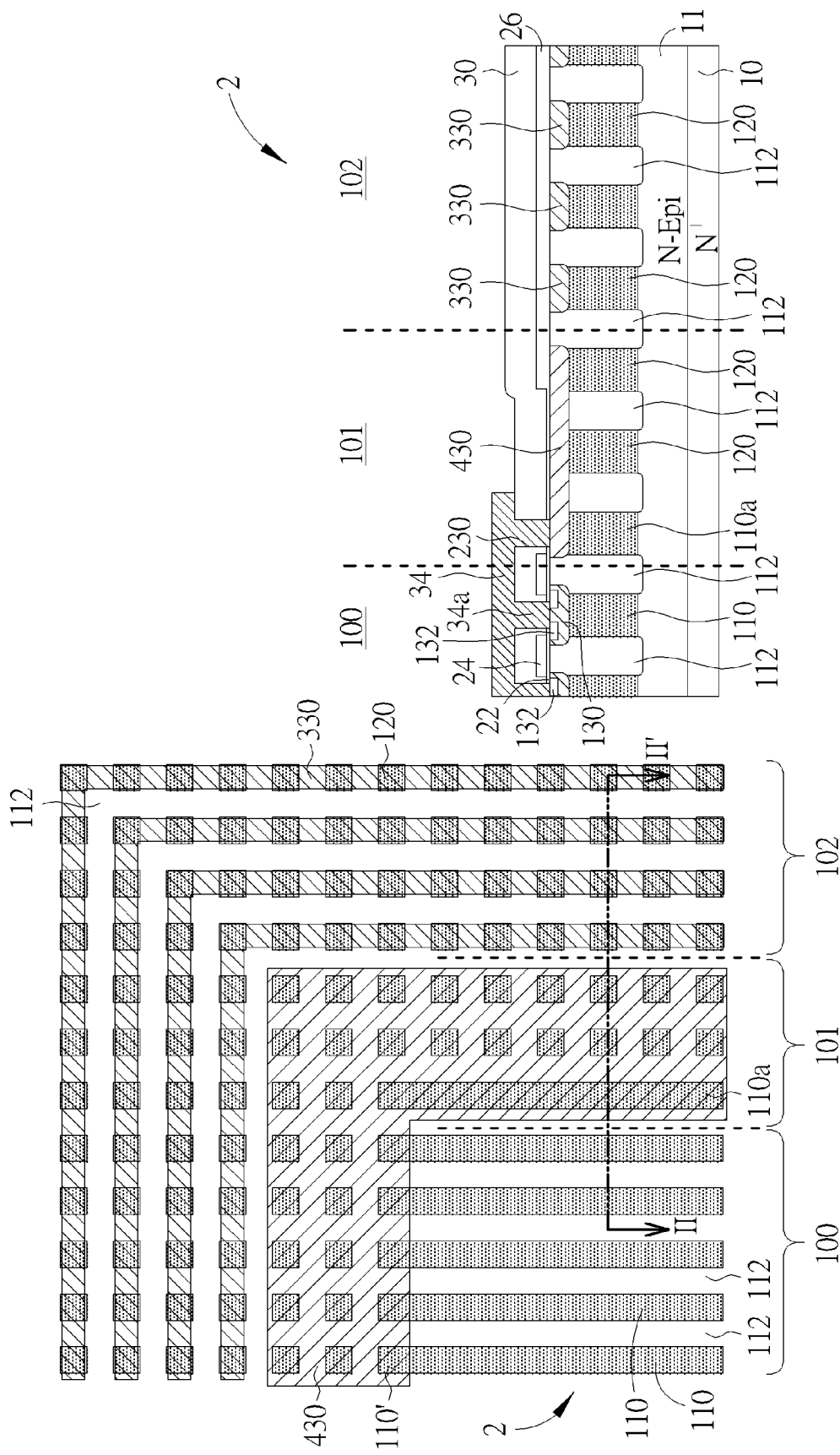

POWER SEMICONDUCTOR DEVICE AND FABRICATION METHOD THEREOF

CROSS REFERENCE TO RELATED APPLICATIONS

This application is a continuation of U.S. application Ser. No. 13/902,850 filed May 26, 2013 now U.S. Pat. No. 8,963,260, which is included in its entirety herein by reference.

BACKGROUND OF THE INVENTION

1. Field of the Invention

The present invention relates generally to the field of semiconductor technology. More particularly, the present invention relates to a method for fabricating a power semiconductor device with super junction structure.

2. Description of the Prior Art

As known in the art, super junction power MOSFET devices include alternating p-type and n-type regions below the active regions of the device. The alternating p-type and n-type regions in a super junction power MOSFET device are ideally in charge balance so that those regions deplete one another under a reverse voltage condition, thereby enabling the device to better withstand breakdown.

However, the aforesaid super junction power MOSFET devices have some drawbacks. For example, due to the increased doping concentration of the substrate (or base) in the withstanding termination region, the ability to sustain high voltages is now inadequate even incorporated with the design of floating ring or field plate.

There is a need for improved methods of fabrication that can provide improved performance of the power devices.

SUMMARY OF THE INVENTION

It is therefore one object of the present invention to provide an improved power semiconductor device and fabrication method in order to solve the above-mentioned overlay problems.

According to an embodiment, a power semiconductor device includes a cell region on a semiconductor substrate, at least a transistor device in the cell region, a peripheral termination region encompassing the cell region, a plurality of islands of first epitaxial layer (epitaxial islands) arranged around the cell region, and a grid type second epitaxial layer in the peripheral termination region. The grid type second epitaxial layer separates the plurality of epitaxial islands from one another.

The plurality of islands of first epitaxial layer have a first conductivity type, the semiconductor substrate has a second conductivity type, the grid-shaped second epitaxial layer has the second conductivity type.

The power semiconductor device may further include a third epitaxial layer between the first epitaxial layer, the second epitaxial layer and the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 is a schematic top view showing an exemplary layout of the power semiconductor transistor device with super junction structure;

FIG. 2 is an enlarged partial view of the power semiconductor transistor device in FIG. 1;

FIG. 3 is a schematic, cross-sectional view taken along line I-I' in FIG. 2;

FIG. 4 is an enlarged partial view of the power semiconductor transistor device;

FIG. 5 is a schematic, cross-sectional view taken along line II-II' in FIG. 4;

Figures 6, 7:
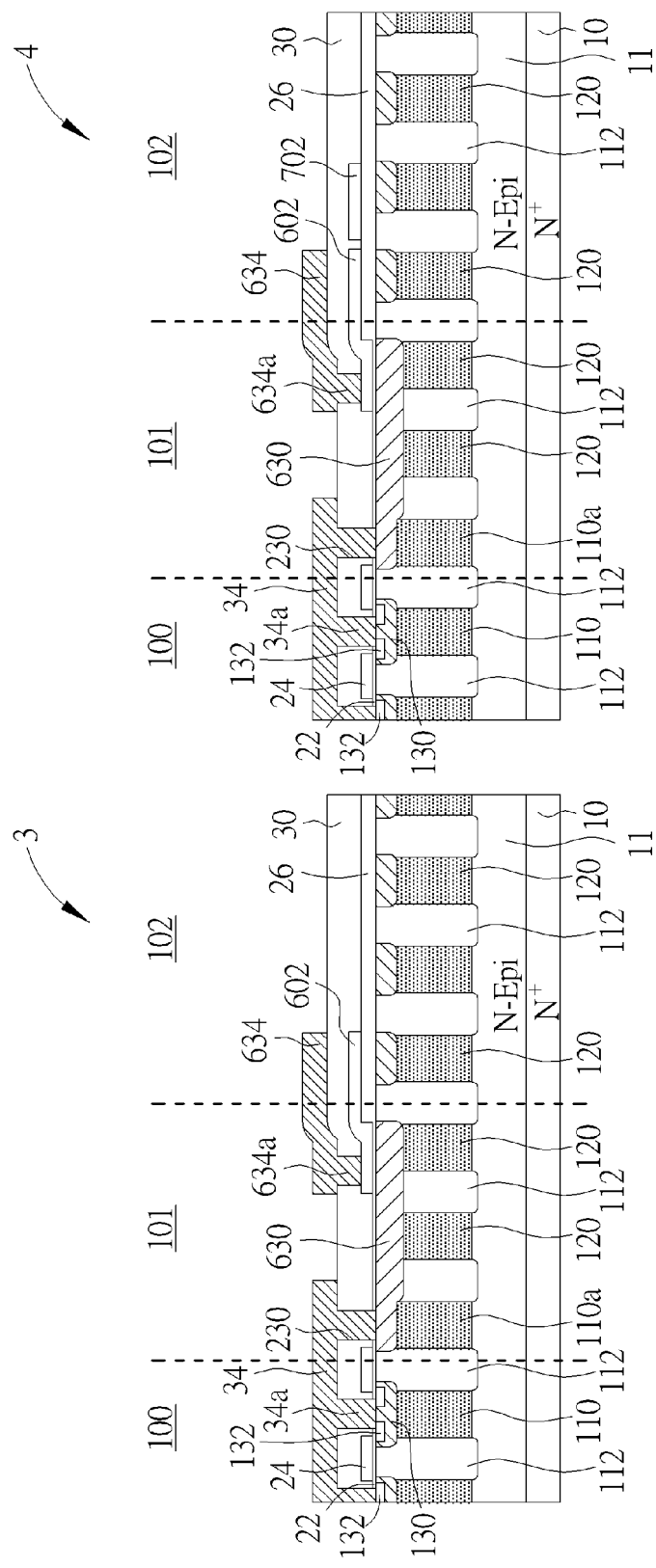
FIG. 6 is a schematic, cross-sectional diagram demonstrating a power semiconductor transistor device with super junction structure according to a third embodiment of the invention.
FIG. 7 is a schematic, cross-sectional diagram demonstrating a power semiconductor transistor device with super junction structure according to a fourth embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known process steps such as lithographic and etching processes are not disclosed in detail, as these should be well-known to those skilled in the art. It should be recognized that although the present invention has been illustrated schematically with the use of certain conductivity types, the opposite conductive types can also be implemented.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

The following sets forth a detailed description of a mode for carrying out the invention. The description is intended to be illustrative of the invention and should not be taken to be limiting.

FIGS. 1-3 are schematic diagrams demonstrating a power semiconductor transistor device with super junction structure according to one embodiment of the invention, wherein FIG. 1 is a schematic top view showing an exemplary layout of the power semiconductor transistor device with super junction structure, FIG. 2 is an enlarged partial view of the power semiconductor transistor device in FIG. 1, and FIG. 3 is a schematic, cross-sectional view taken along line I-I' in FIG. 2. First, as shown in FIG. 1, the power semiconductor transistor device 1 comprises a cell region 100 and a termination region 102 that encompasses the cell region 100. The cell region 100 is used to accommodate a semiconductor transistor device with switching ability, such as a MOSFET. The termination region 102 comprises a voltage sustaining structure which functions as a barrier for preventing the spreading of the high intensity electric field generated from the cell region 100. For the sake of simplicity, FIG. 1 merely shows the alternately arranged first conductivity type (e.g. P type) epitaxial layers 110 and second conductivity type (e.g. N type) epitaxial layers 112 within the cell region 100, and the plurality of first conductivity type (e.g. P type) epitaxial islands 120 within the termination region 102.

As shown in FIG. 2 and FIG. 3, according to the first embodiment, the power semiconductor transistor device 1 comprises a semiconductor substrate 10 having the second conductivity type, for example, heavily doped N+ silicon substrate, which can function as a drain electrode of the power semiconductor transistor device 1. An epitaxial layer 11 having the second conductivity type (e.g. N type) is formed on the semiconductor substrate 10. On the epitaxial layer 11, a plurality of alternately arranged epitaxial layers is provided. The alternately arranged epitaxial layers include first conductivity type (e.g. P type) epitaxial layers 110, first conductivity type (e.g. P type) epitaxial islands 120, and second conductivity type (e.g. N type) epitaxial layers 112. According to the first embodiment, the epitaxial layers 110 and the epitaxial layers 112 are line-shaped regions alternately arranged and in parallel to one another within the cell region 100, thereby forming the super junction structure. The epitaxial islands 120 are disposed within the termination region 102 and are arranged annularly in an array manner to thereby form multiple rings that encompass the cell region 100. In the figures, only six rings of the epitaxial islands 120 are demonstrated. However, it is understood that the six rings of the epitaxial islands 120 in FIG. 2 are only for illustration purposes and should not be taken limiting. According to the first embodiment, a grid-shaped or mesh-like epitaxial layer 112 is disposed in the termination region 102 to surround each of the epitaxial islands 120 and separates the epitaxial islands 120 from one another.

Within the cell region 100, a first conductivity type (e.g. P type) ion well 130 is disposed at an upper portion of each of the epitaxial layers 110. A source doing region 132 is disposed in the ion well 130. According to the first embodiment, in the ion well 130 on the outermost epitaxial layer 110a that is in proximity to the peripheral termination region 102, no source doping region is formed.

According to the first embodiment, within the cell region 100, gates 24 are formed on the respective epitaxial layers 112. A gate oxide layer 22 is provided between each of the gates 24 and the each of the epitaxial layers 112. According to the first embodiment, within the peripheral termination region 102, continuous, annular first conductivity type (e.g. P type) doping regions 330 are provided. The continuous, annular first conductivity type doping regions 330 respectively annularly string each ring of the epitaxial islands 120. The continuous, annular first conductivity type doping region 330 may partially overlap with the epitaxial islands 120 in each ring. An inter-layer dielectric layer 30 covers the cell region 100 and the peripheral termination region 102. A metal layer 34 is disposed on the inter-layer dielectric layer 30 and is electrically connected to the source doping region 132 and the ion well 130 within the cell region 100 through the contact plug 34a in the contact hole 230. According to the first embodiment, in the peripheral termination region 102, a field oxide layer 26 is formed under the inter-layer dielectric layer 30.

FIG. 4 and FIG. 5 are schematic diagrams demonstrating a power semiconductor transistor device with super junction structure according to a second embodiment of the invention. FIG. 4 is an enlarged partial view of the power semiconductor transistor device and FIG. 5 is a schematic, cross-sectional view taken along line II-II' in FIG. 4. As shown in FIG. 4, likewise, the power semiconductor transistor device 2 comprises a cell region 100 and a peripheral termination region 102 that encompasses the cell region 100. According to the second embodiment, a transition region 101 is interposed between the cell region 100 and the peripheral termination region 102.

As shown in FIG. 4 and FIG. 5, the power semiconductor transistor device 2 comprises a semiconductor substrate 10 having the second conductivity type, for example, heavily doped N+ silicon substrate, which can function as a drain electrode of the power semiconductor transistor device 1. An epitaxial layer 11 having a second conductivity type (e.g. N type) is formed on the semiconductor substrate 10. On the epitaxial layer 11, a plurality of alternately arranged epitaxial layers is provided. The alternately arranged epitaxial layers include first conductivity type (e.g. P type) epitaxial layers 110, first conductivity type (e.g. P type) epitaxial islands 120, and second conductivity type (e.g. N type) epitaxial layers 112. According to the first embodiment, the epitaxial layers 110 and the epitaxial layers 112 are line-shaped regions alternately arranged and in parallel to one another within the cell region 100. The epitaxial islands 120 are disposed within the termination region 102 and are arranged annularly in an array manner to thereby form multiple rings that encompass the cell region 100. Within the cell region 100, a first conductivity type (e.g. P type) ion well 130 is disposed at an upper portion of each of the epitaxial layers 110. A source doing region 132 is disposed in the ion well 130. According to the first embodiment, in the ion well 130 on the outermost epitaxial layer 110a that is in proximity to the peripheral termination region 102, no source doping region is formed.

According to the second embodiment, within the cell region 100, gates 24 are formed on the respective epitaxial layers 112. A gate oxide layer 22 is provided between each of the gates 24 and the each of the epitaxial layers 112. Likewise, within the peripheral termination region 102, continuous, annular first conductivity type (e.g. P type) doping regions 330 are provided. The continuous, annular first conductivity type doping regions 330 respectively annularly string each ring of the epitaxial islands 120. The continuous, annular first conductivity type doping region 330 may partially overlap with the epitaxial islands 120 in each ring. An inter-layer dielectric layer 30 covers the cell region 100 and the peripheral termination region 102. A metal layer 34 is disposed on the inter-layer dielectric layer 30 and is electrically connected to the source doping region 132 and the ion well 130 within the cell region 100 through the contact plug 34a in the contact hole 230. According to the second embodiment, in the peripheral termination region 102, a field oxide layer 26 is formed under the inter-layer dielectric layer 30.

In the transition region 101, a first conductivity type (e.g. P type) doping region 430 traverses the epitaxial layer 110a, the first ring and second ring of epitaxial islands 120 which are adjacent to the cell region 100. The first conductivity type doping region 430 has an annular layout, in this case, with a rectangular outline, which covers the first ring and second ring of the epitaxial islands 120, the epitaxial layer 110a, and the end portions of the epitaxial layers 110 within the cell region 100. According to the second embodiment, the first conductivity type doping region 430 is electrically connected to the metal layer 34 through the contact plug 34a in the contact hole 230. The transition region 101 can alleviate the strength of the electric field across the cell region 100 and the peripheral termination region 102.

FIG. 6 is a schematic, cross-sectional diagram demonstrating a power semiconductor transistor device with super junction structure according to a third embodiment of the invention. The differences between the power semiconductor transistor device 3 in FIG. 6 and the embodiment in FIG. 5 include: (1) a first conductivity type (e.g. P type) guard ring doping region 630 in the transition region 101, which traverses the epitaxial layer 110a, the first ring and second ring of epitaxial islands 120 which are adjacent to the cell region 100, wherein the guard ring doping region 630 has a doping concentration and doping depth that are both greater than that of the ion well 130 on the epitaxial layer 110a; (2) the ion well 130 overlaps with the guard ring doping region 630; (3) a gate structure 602 is disposed on the guard ring doping region 630, and the gate structure traverses the transition region 101 and the peripheral termination region 102, and further extends to the field oxide layer 26, wherein the gate structure 602 is electrically connected to the metal layer 634 through the contact plug 634a.

FIG. 7 is a schematic, cross-sectional diagram demonstrating a power semiconductor transistor device with super junction structure according to a fourth embodiment of the invention. The differences between the power semiconductor transistor device 4 in FIG. 7 and the embodiment in FIG. 6 include: a field plate 702 is disposed on the field oxide layer 26 and is adjacent to the gate structure 602, wherein the gate structure 602 and the field plate 702 maybe annular shaped, and may be composed of polysilicon. According to the fourth embodiment, the field plate 702 is located within the peripheral termination region 102.

Figures 8, 9:
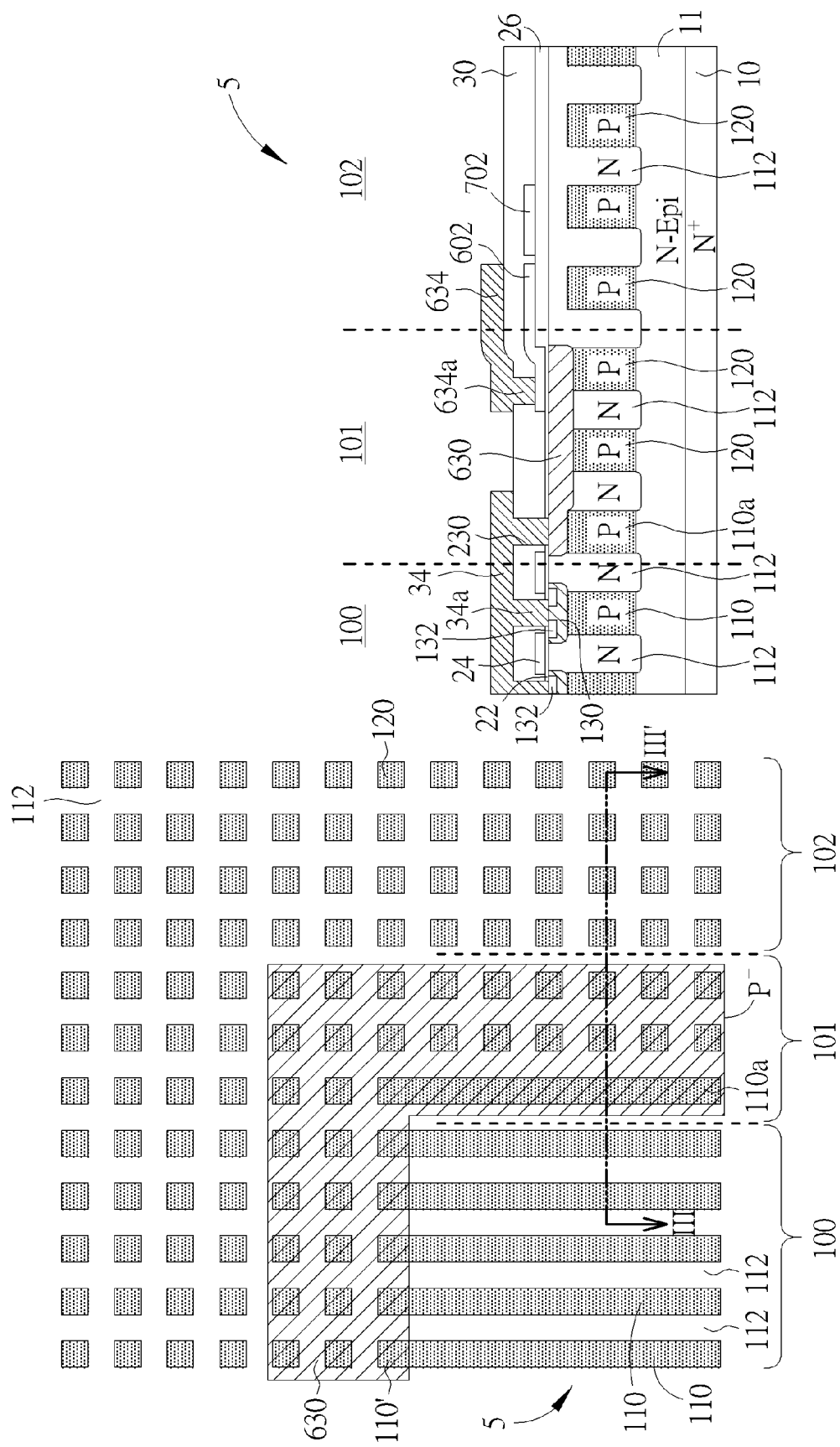
FIG. 8 is an enlarged partial view of the power semiconductor transistor device 5.
FIG. 9 is a schematic, cross-sectional view taken along line III-III' in FIG. 8.

FIG. 8 and FIG. 9 are schematic diagrams demonstrating a power semiconductor transistor device with super junction structure according to a fifth embodiment of the invention. FIG. 8 is an enlarged partial view of the power semiconductor transistor device 5 and FIG. 9 is a schematic, cross-sectional view taken along line III-III' in FIG. 8. The differences between the power semiconductor transistor device 5 in FIGS. 8-9 and the fourth embodiment in FIG. 7 include: the epitaxial islands 120 in the peripheral termination region 102 are independent and are isolated from one another. That is, the epitaxial islands 120 in the peripheral termination region 102 are not strung by a continuous, annular first conductivity type (e.g. P type) doping region 330 as set forth in FIG. 7. In FIG. 9, within the peripheral termination region 102, the epitaxial layer 112 is above the epitaxial islands 120.

Figure 10:
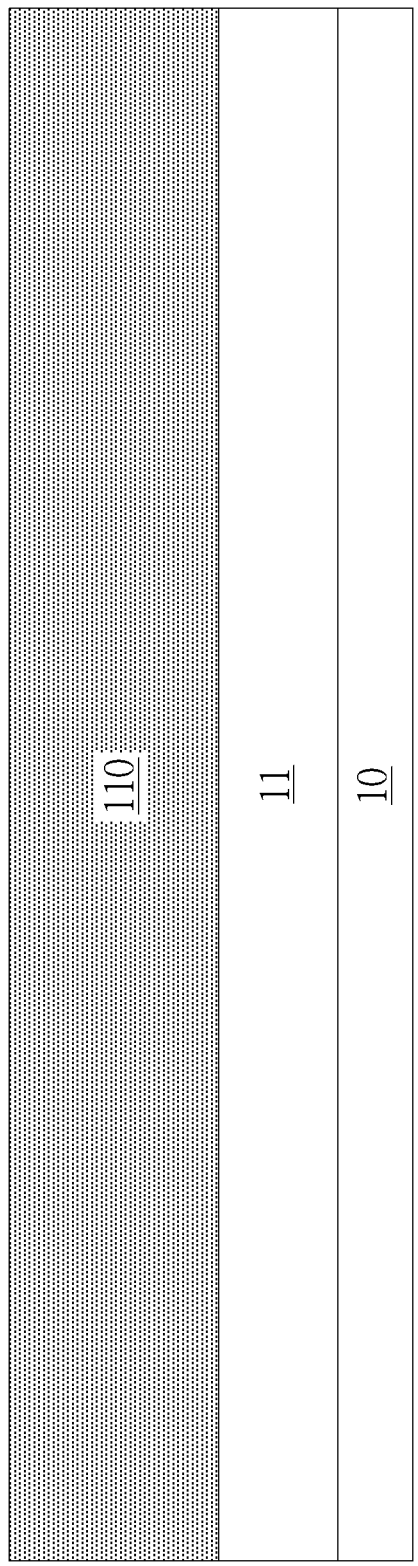
FIGS. 10-19 are schematic diagrams showing an exemplary method for making a power semiconductor transistor device with super junction structure as set forth in FIG. 6.

FIGS. 10-19 are schematic diagrams showing an exemplary method for making a power semiconductor transistor device with super junction structure as set forth in FIG. 6. First, as shown in FIG. 10, a semiconductor substrate 10 is provided. The semiconductor substrate 10 has the second conductivity type, for example, heavily doped N+ silicon substrate, which can function as a drain electrode of the power semiconductor transistor device 1. An epitaxial layer 11 having the second conductivity type (e.g. N type) is then formed on the semiconductor substrate 10. An epitaxial layer 110 having the first conductivity type (e.g. P type) is then formed on the epitaxial layer 11.

Figure 11:
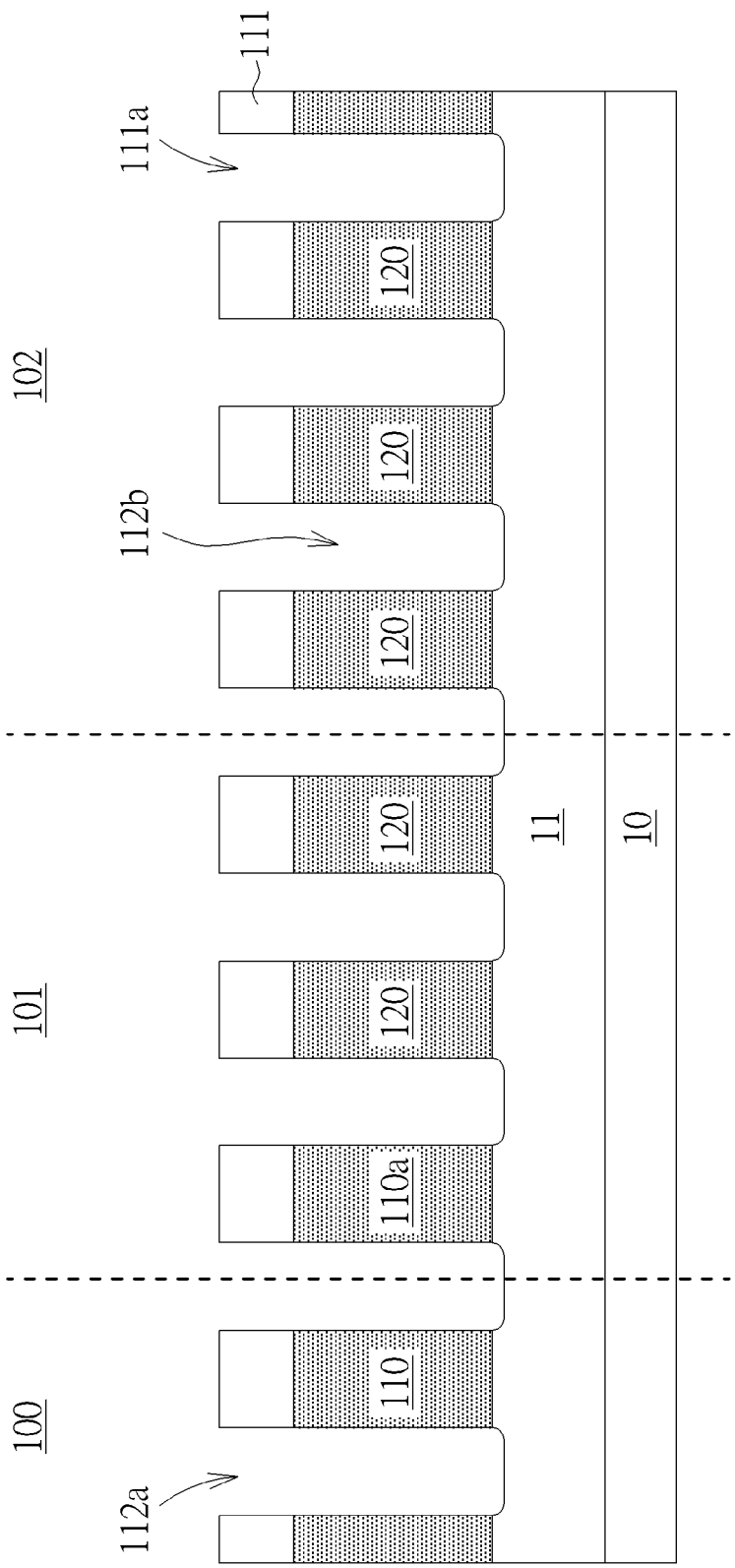
Figure 20:
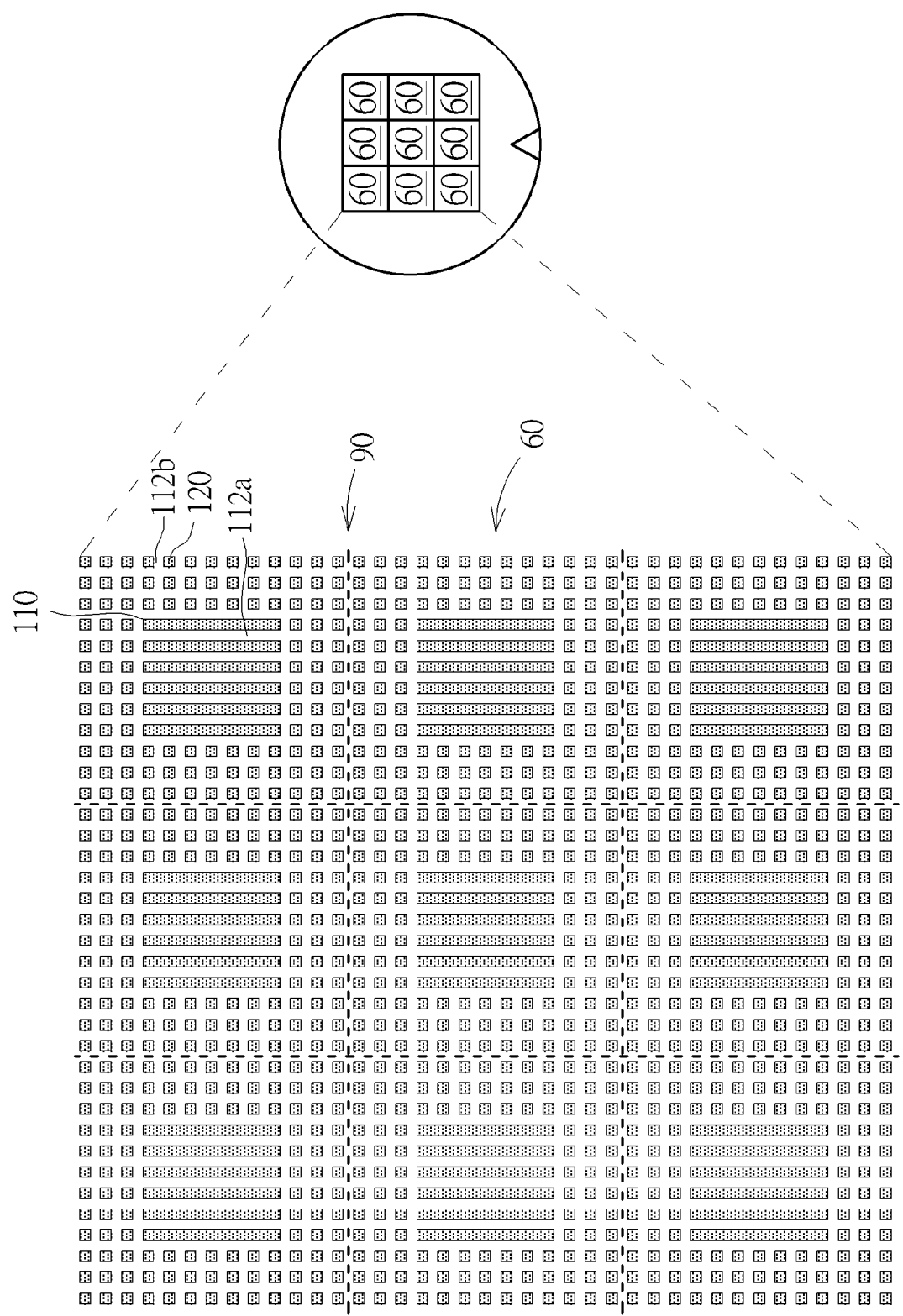
FIG. 20 is a schematic top view of a wafer showing that the trench structures are etched in the epitaxial layer at wafer level and are etched across the wafer.

As shown in FIG. 11, a patterned hard mask layer 111 is formed on the epitaxial layer 110. Using the patterned hard mask layer 111 as an etching hard mask, a dry etching process is carried out to etch trench structures 112a and trench structures 112b though the openings 111a in the patterned hard mask layer 111, and concurrently, define the straight line-shaped first conductivity type epitaxial layers 110 in the cell region 100 and a plurality of first conductivity type epitaxial islands 120 in the peripheral termination region 102. The trench structures 112a are also straight line-shaped and are in parallel with the first conductivity type epitaxial layers 110. The trench structures 112b have a grid-shaped or mesh-like trench pattern when viewed from the above, which surround each of the first conductivity type epitaxial islands 120, as shown in FIG. 20. It is noteworthy that the trench structures 112a and trench structures 112b are etched at wafer level and are etched across the wafer. That is, as shown in FIG. 20, the trenches are etched traversing different dies 60. Between the dies 60 are scribe lines 90. The trench structures 112b may be formed in the scribe lines 90 and may be aligned with the trench structures 112a.

Figure 12:
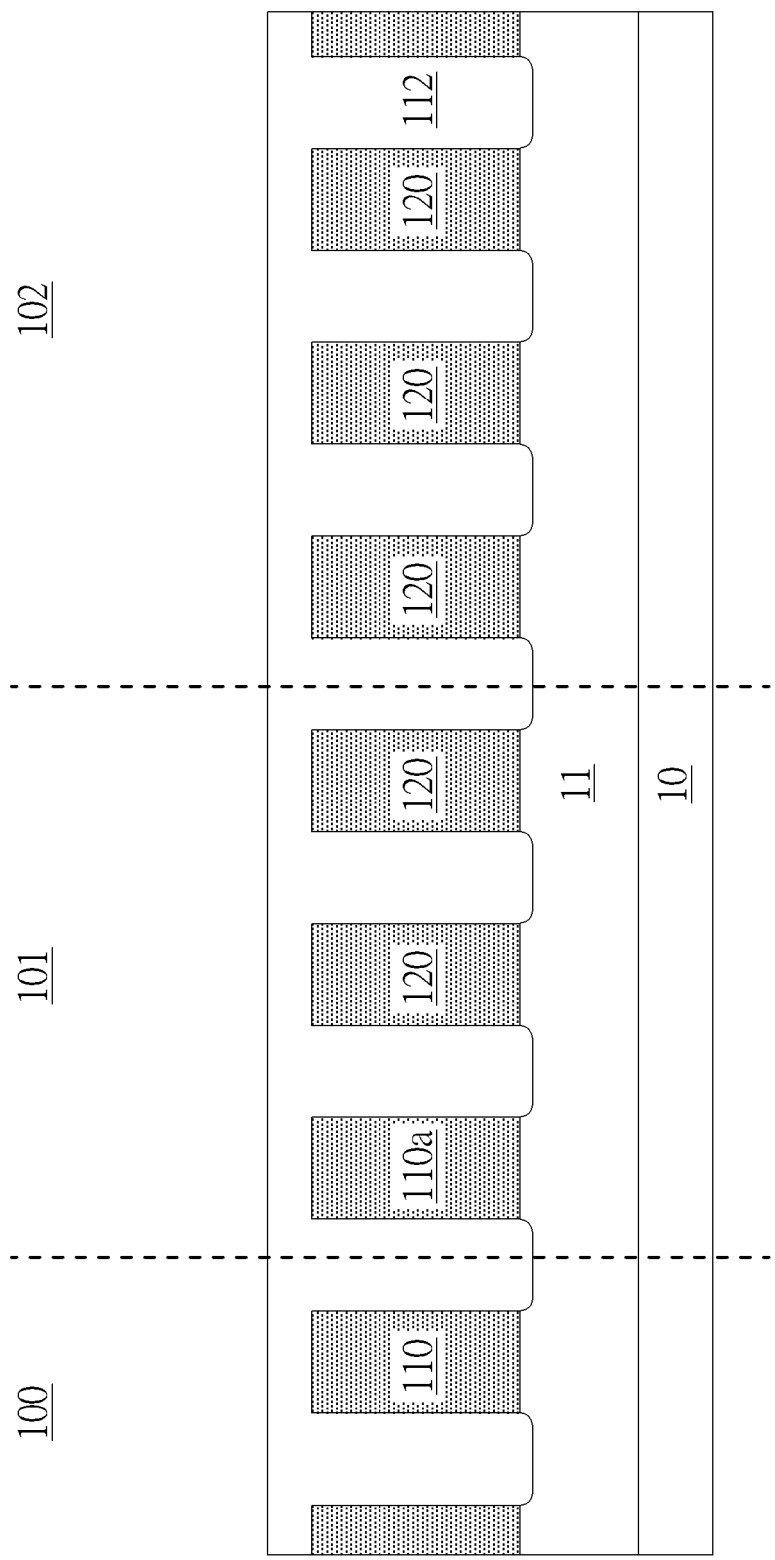

As shown in FIG. 12, after forming the trench structures 112a and the trench structures 112b, a sacrificial oxide layer (not shown) may be formed on the interior surfaces of the trenches, and then removed. Subsequently, the second conductivity type (e.g. N type) epitaxial layer 112 is filled into the trench structures 112a and the trench structures 112b. The second conductivity type epitaxial layer 112 may cover the first conductivity type epitaxial layer 110. A chemical mechanical polishing (CMP) process may be performed to remove a portion of the epitaxial layer 112. An oxidation process is then performed to form an oxide layer (not shown). Thereafter, the oxide layer is removed. An epitaxial process with the first conductivity type may be performed.

Figure 13:
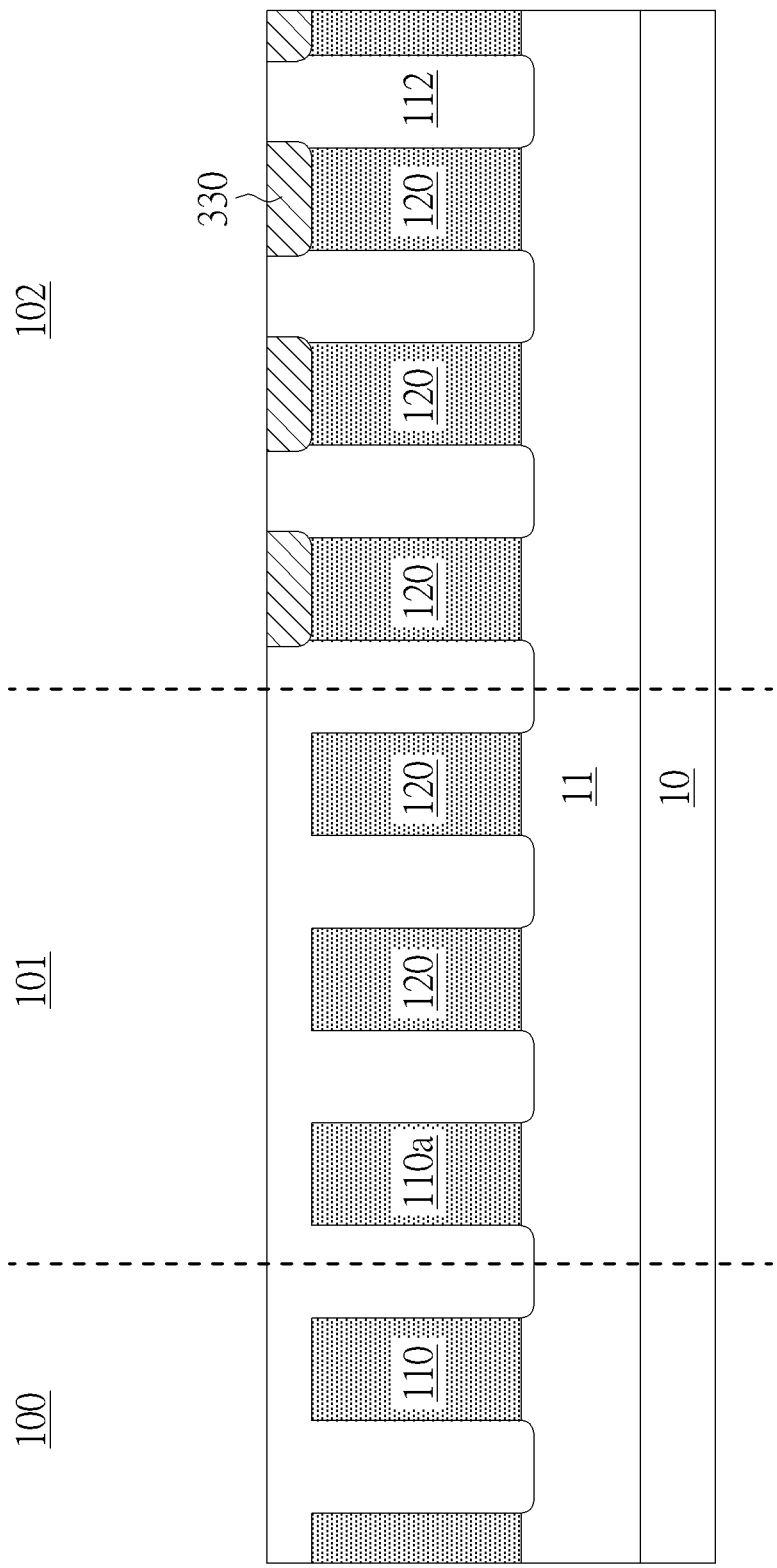

As shown in FIG. 13, an ion implantation process is performed to form a continuous, annular first conductivity type (e.g. P type) doping region 330. The continuous, annular first conductivity type doping region 330 is formed in the epitaxial layer 112 and strings each ring of the epitaxial islands 120. The continuous, annular first conductivity type doping region 330 may partially overlap with each ring of the epitaxial islands 120.

Figure 14:
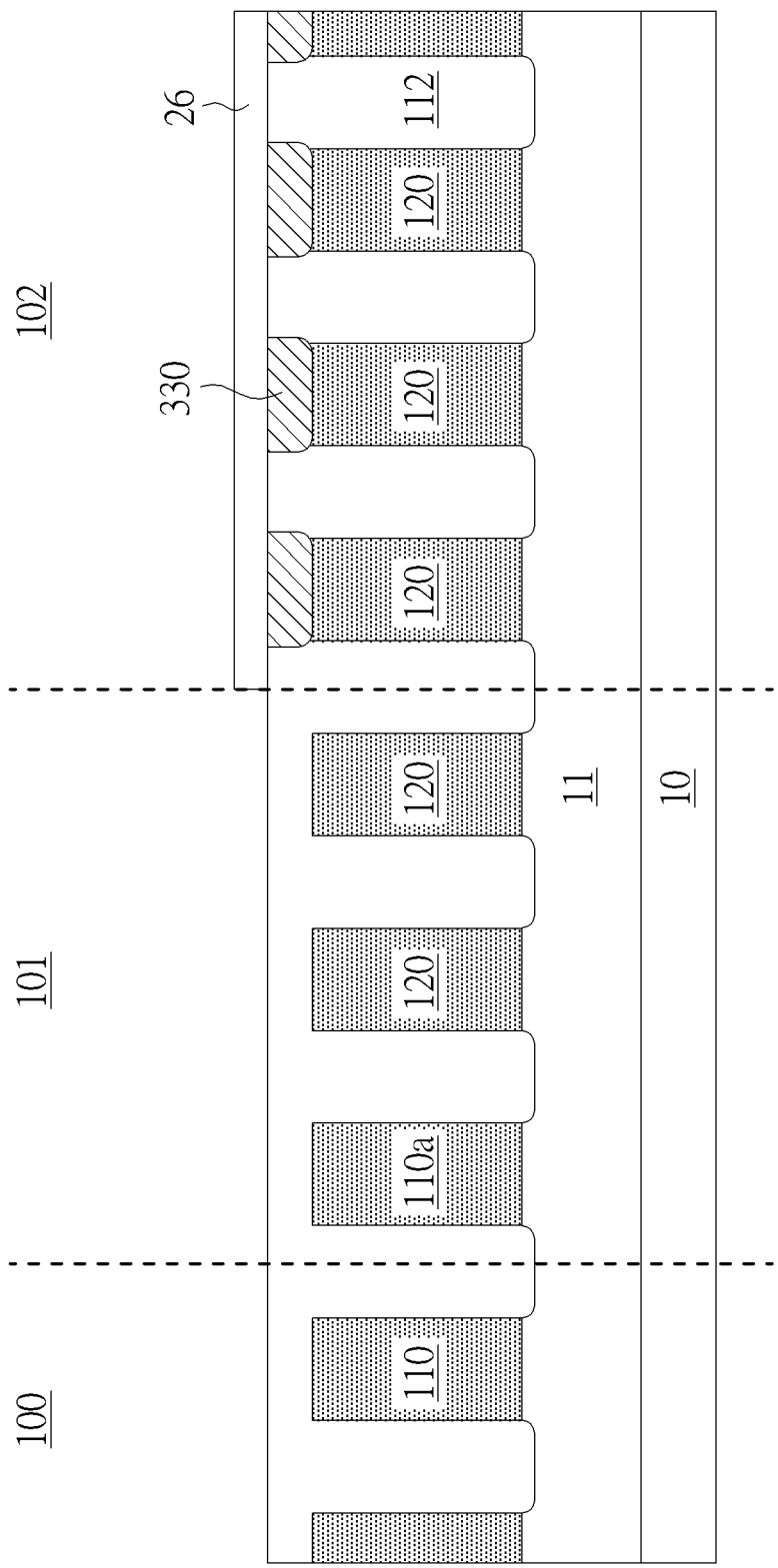

As shown in FIG. 14, a field oxide layer 26 is then formed on the epitaxial layer 112. A lithographic process and an etching process are carried out to remove the field oxide layer 26 from the cell region 100 and from the transition region 101, thereby revealing the epitaxial layer 112 in the cell region 100 and the transition region 101. The field oxide layer 26 in the peripheral termination region remains intact.

Figure 15:
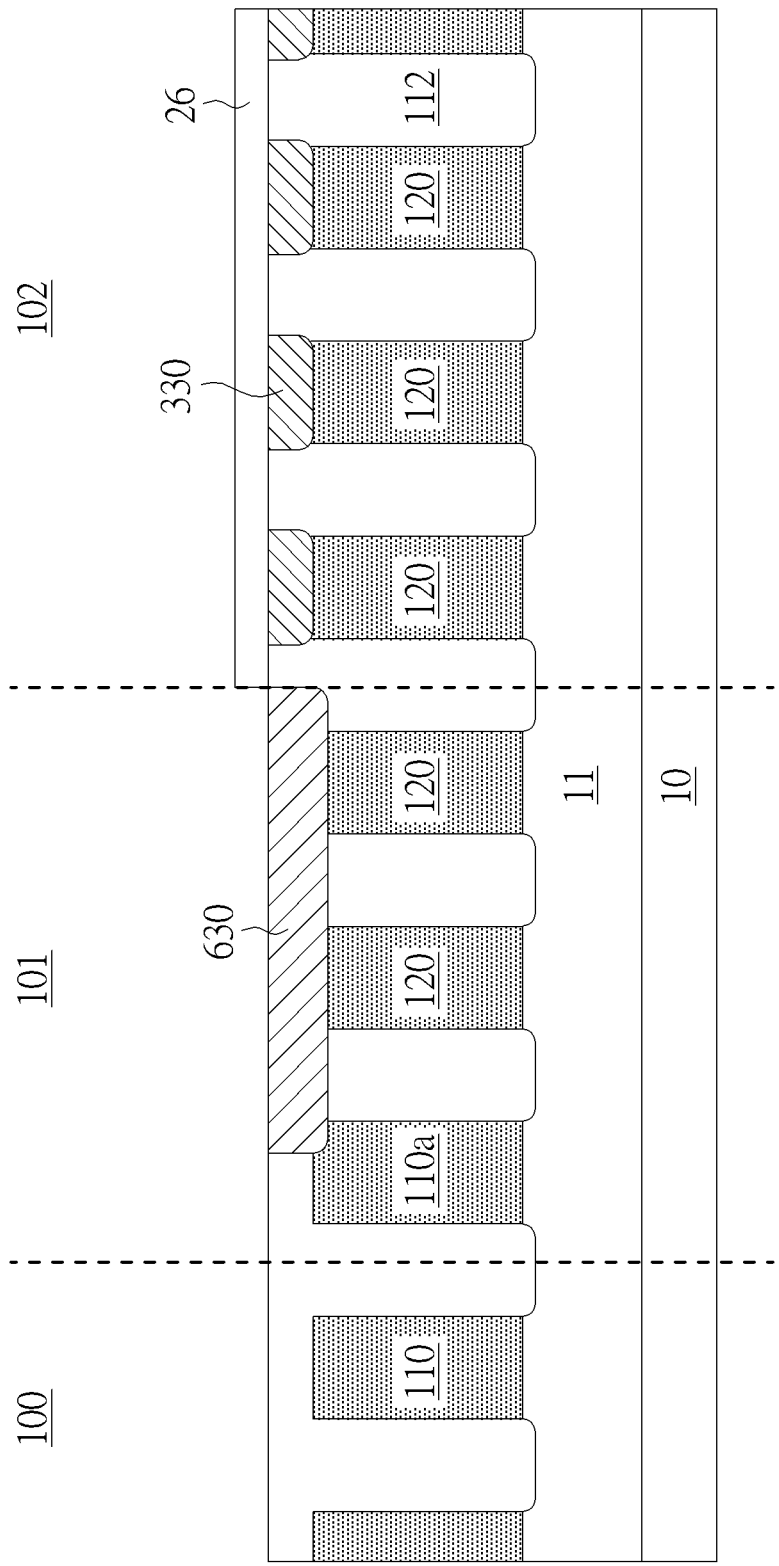

As shown in FIG. 15, by using the lithographic process and the implantation process, the first conductivity type (e.g. P type) dopants such as boron are implanted into the epitaxial layer 112 in the transition region 101, thereby forming the first conductivity type guard ring doping region 630. The guard ring doping region 630 has an annular shape.

Figure 16:
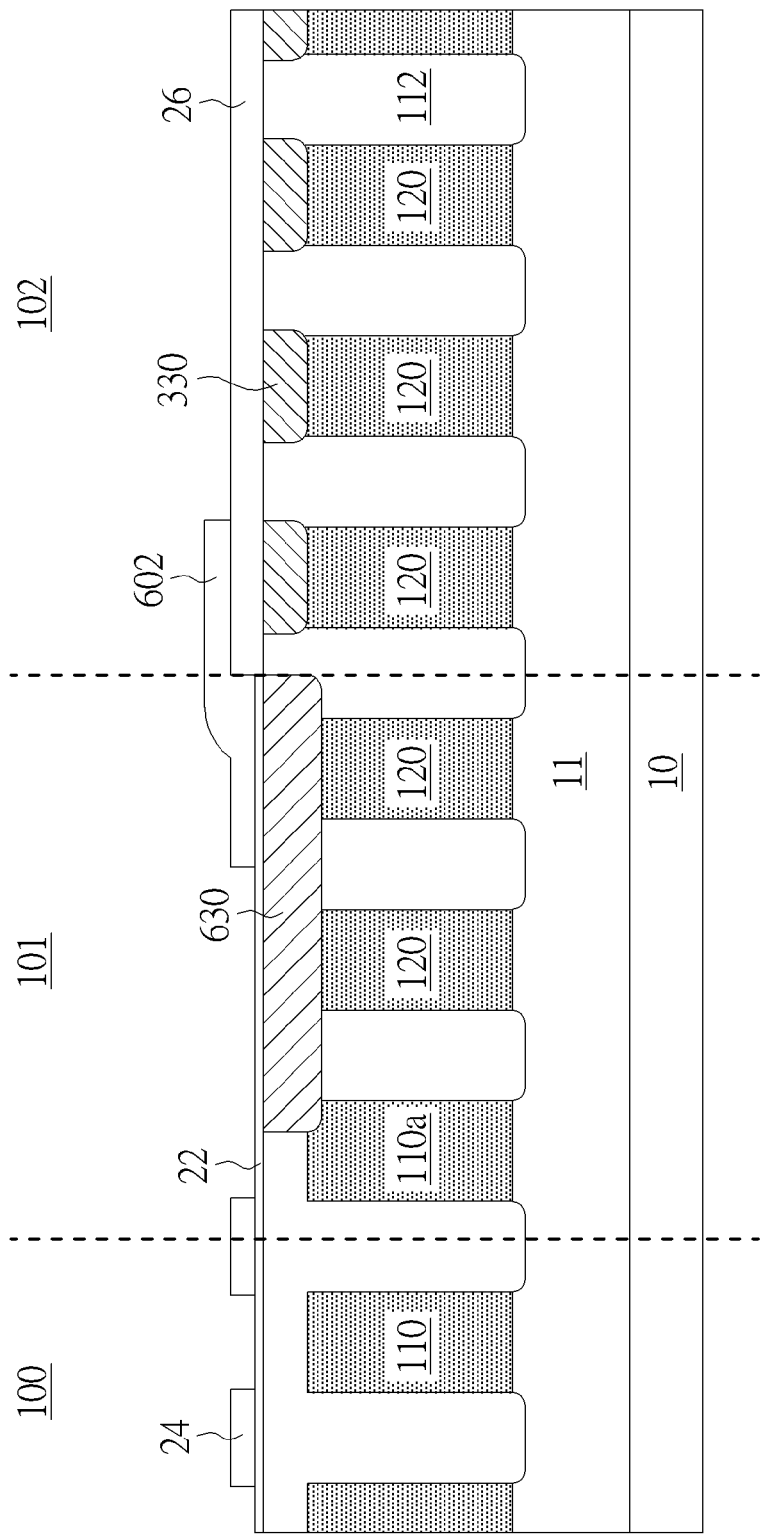

As shown in FIG. 16, an oxidation process is performed to form the gate oxide layer 22 on the epitaxial layer 112. A chemical vapor deposition (CVD) is then performed to deposit a polysilicon layer in a blanket manner. A lithographic process and etching process are carried out to etch the polysilicon layer to define the gates 24 in the cell region 100 and gate structure 602 in the peripheral termination region 102.

Figure 17:
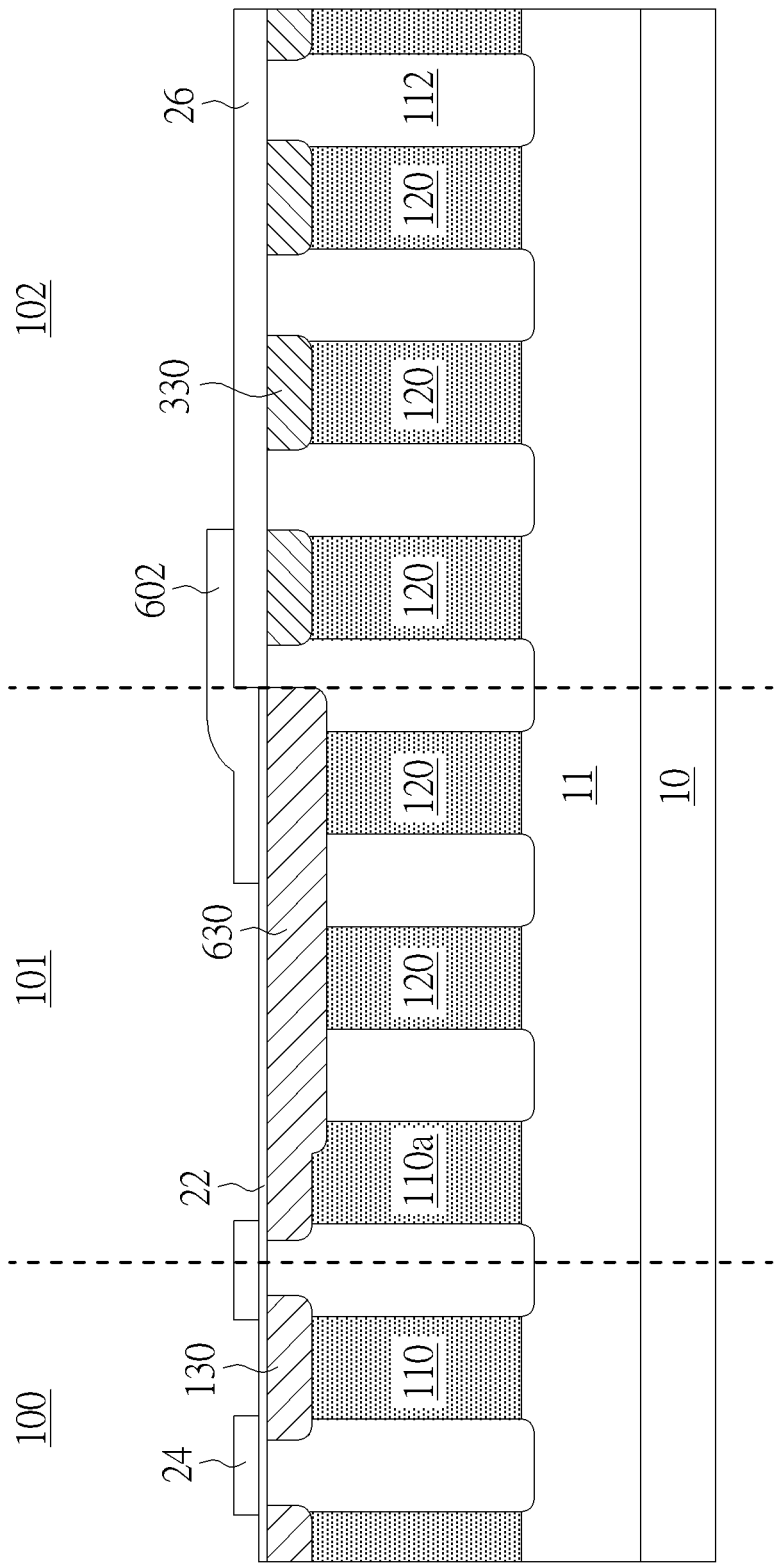

As shown in FIG. 17, by using lithographic process and implantation process, the first conductivity type (e.g. P type) ion well 130 is implanted into the upper portion of each of the epitaxial layers 110 in the cell region 100, and upper portion of the epitaxial layer 110a. The ion well 130 on the epitaxial layer 110a overlaps with the guard ring doping region 630. The implantation process for forming the ion well 130 is self-aligned with the gates 24, while the ion well 130 is not formed in the peripheral termination region 102 that is covered with a photoresist.

Figure 18:
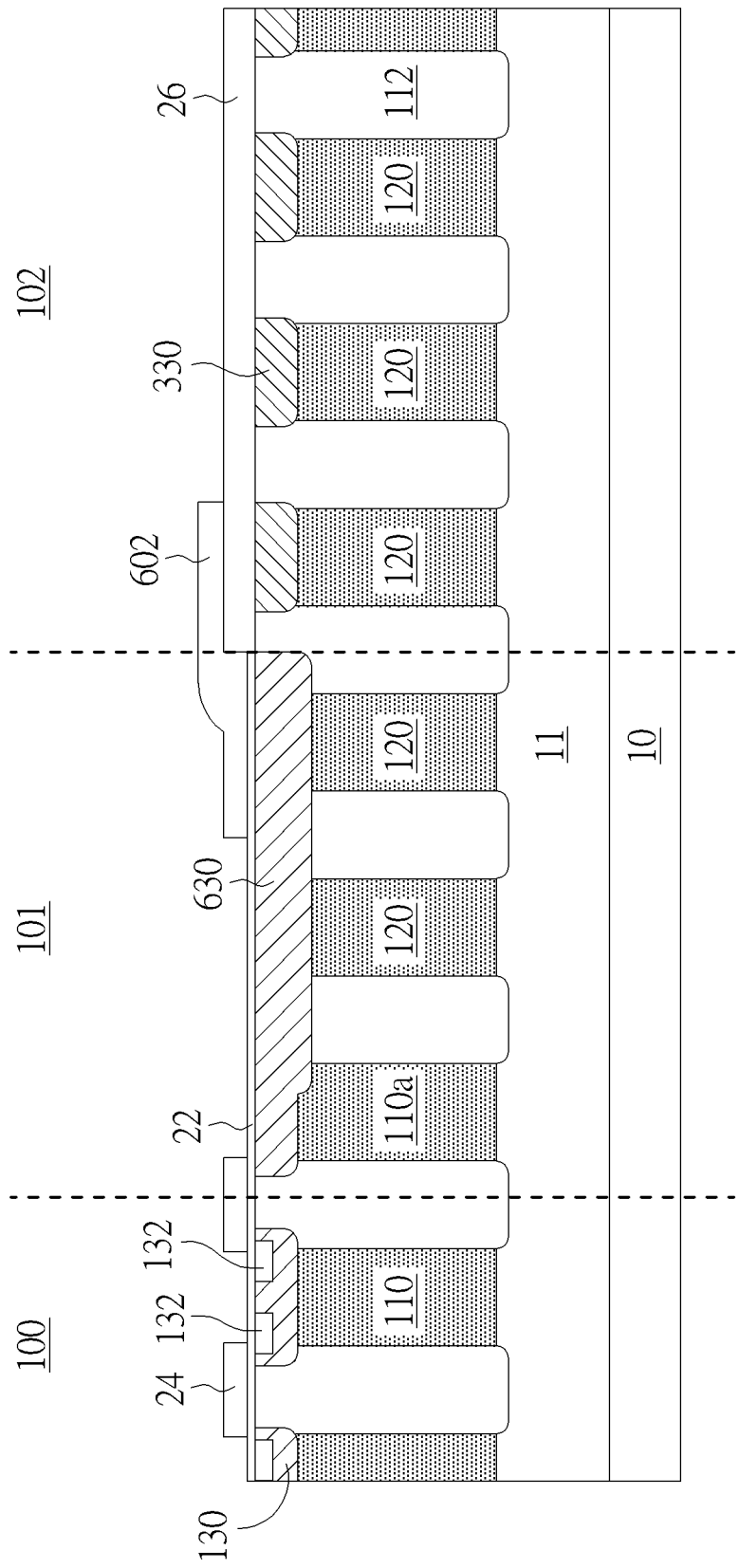
Figure 19:
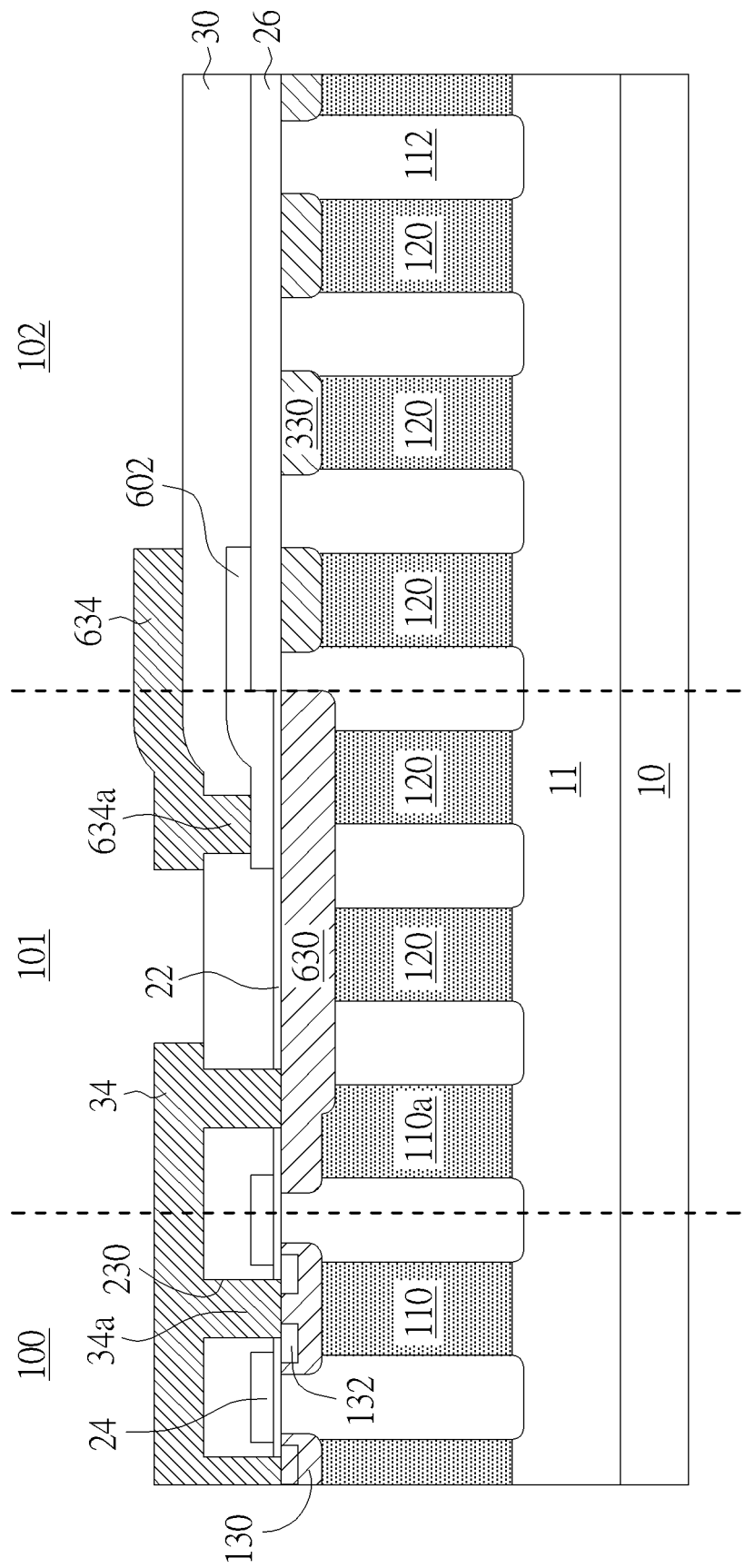

As shown in FIG. 18, the lithographic process and implantation process are performed to form the source doping region 132 in the ion well 130. Finally, as shown in FIG. 19, the inter-layer dielectric layer 30 is deposited to cover the gates 24 and the gate structure 602. Subsequently, using the lithographic process and the etching process, a contact hole 230 is formed in the inter-layer dielectric layer 30. The metal layer 34 is deposited into the contact hole, thereby forming the contact plug 34a and 634a, through which the metal layer 34 is electrically connected to the source doping region 132 and ion well 130 in the cell region 100, and the metal layer 634 is electrically connected to the gate structure 602.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power semiconductor device, comprising:
   a cell region on a semiconductor substrate;
   at least one transistor device disposed in the cell region;
   a peripheral termination region surrounding the cell region;
   a transition region interposed between the cell region and the peripheral termination region;
   a guard ring doping region in the transition region;
   a gate structure disposed on the guard ring doping region;
   a field oxide layer on the peripheral termination region;
   a field plate on the field oxide layer;
   a plurality of islands of first epitaxial layer disposed in the peripheral termination region; and
   a grid-shaped second epitaxial layer in the peripheral termination region, the grid-shaped second epitaxial layer surrounds each of the plurality of islands of first epitaxial layer to thereby separate the plurality of islands of first epitaxial layer from one another.

2. The power semiconductor device according to claim 1 wherein the transition region has an annular shape.

3. The power semiconductor device according to claim 1 wherein the guard ring doping region has the first conductivity type.

4. The power semiconductor device according to claim 1 wherein the gate structure traverses the transition region and the peripheral termination region and extends to the field oxide layer.

5. The power semiconductor device according to claim 1 wherein the gate structure and the field plate are composed of polysilicon.

* * * * *